US007023298B1

(12) United States Patent
Palinkas et al.

(10) Patent No.: US 7,023,298 B1
(45) Date of Patent: Apr. 4, 2006

(54) METHOD AND APPARATUS FOR DESTRUCTIBLE TRAP/FILTER

(75) Inventors: Ray Palinkas, Canastota, NY (US); Noah Montena, Syracuse, NY (US)

(73) Assignee: John Mezzalingua Associates, Inc., East Syracuse, NY (US)

( * ) Notice: Subject to any disclaimer, the term of this patent is extended or adjusted under 35 U.S.C. 154(b) by 8 days.

(21) Appl. No.: 10/963,208

(22) Filed: Oct. 12, 2004

(51) Int. Cl.
*H03H 7/00* (2006.01)

(52) U.S. Cl. ........................ 333/185; 333/176; 439/620

(58) Field of Classification Search .................. 333/12, 333/176, 182, 183, 185; 439/607, 620
See application file for complete search history.

(56) References Cited

U.S. PATENT DOCUMENTS 4,451,803 A 5/1984 Holdworth et al.
5,150,087 A * 9/1992 Yoshie et al. ............... 333/185
5,278,525 A * 1/1994 Palinkas ..................... 333/175
6,429,754 B1 8/2002 Zennamo, Jr. et al.
6,636,129 B1 10/2003 Zennamo, Jr. et al.

* cited by examiner

*Primary Examiner*—Seungsook Ham
(74) *Attorney, Agent, or Firm*—Pastel Law Firm; Christopher R. Pastel

(57) ABSTRACT

An electrical filter disconnects a connecting pin when uninstalled. A first filter section includes a first set of electrical filter components, while a second filter section includes a second set of electrical filter components, with the connecting pin connecting the two filter sections. An electrical isolation shield disposed between the first and second filter sections includes a first plate and a second plate which are rotatable with respect to each other, wherein the first plate includes a first cutout portion and the second plate includes a second cutout portion. The first plate is locked to the first filter section while the second plate is locked to the second filter section. When the electrical filter is unscrewed from the port, the first filter section rotates with respect to the second filter section such that the connecting pin breaks electrical connection between the first filter section and the second filter section.

43 Claims, 14 Drawing Sheets

METHOD AND APPARATUS FOR DESTRUCTIBLE TRAP/FILTER

FIELD OF THE INVENTION

This invention relates generally to the field of tunable electrical filters, and more particularly to a tunable electrical filter with a destruction feature that destroys a critical component of the filter when the filter is removed after installation.

BACKGROUND OF THE INVENTION

The cable TV (CATV) industry uses traps and filters installed at a subscriber drop to decode or recover a scrambled pay channel. A problem occurs when these filters and traps are stolen and later sold to persons trying to circumvent having to pay for services.

Conventional tunable filters or cable traps of the kind described are typically referred to as "tuned notch filters" which are used for removing frequency scrambling signals provided within, for example, a TV channel band to eliminate reception of that channel. This is referred to as positive trapping in the art. These filters may also be used for negative trapping, which involves removing specific frequencies within the TV channel band, such as the video carrier, in order to prevent reception of the channel information.

Such tunable notch filters should be capable of approximately 80 dB of attenuation at the center frequency of the notch, and in all cases should be capable of 60 dB at the scramble signal frequency, the notch being sufficiently narrow to prevent serious degradation of the video information. In order to achieve such levels of notch attenuation, conventional filters are designed with one or more filter sections which are employed in cascade to achieve the high attenuation required. One such example of a conventional tunable filter with multiple sections is described in U.S. Pat. No. 5,278,525 issued to Palinkas, incorporated herein by reference.

What is needed is a filter that can be installed without a special tool but which breaks the connection between multiple sections when removed, thus rendering the filter useless for unauthorized reinstallation.

SUMMARY OF THE INVENTION

Briefly stated, an electrical filter disconnects a connecting pin when uninstalled. A first filter section includes a first set of electrical filter components, while a second filter section includes a second set of electrical filter components, with the connecting pin connecting the two filter sections. An electrical isolation shield disposed between the first and second filter sections includes a first plate and a second plate which are rotatable with respect to each other, wherein the first plate includes a first cutout portion and the second plate includes a second cutout portion. The first plate is locked to the first filter section while the second plate is locked to the second filter section. When the electrical filter is unscrewed from the port, the first filter section rotates with respect to the second filter section such that the connecting pin breaks electrical connection between the first filter section and the second filter section.

According to an embodiment of the invention, an electrical filter includes a housing; a first filter section having a first filter circuit, wherein the first filter section is located within and rotatable with respect to the housing; a second filter section having a second filter circuit, wherein the second filter section is located within and locked to the housing; an electrical connector forming an electrical connection between the first filter circuit and the second filter circuit; wherein the first filter section and the second filter section are in a locked position upon rotating the electrical filter in a first direction into a connecting device, and upon rotating the electrical filter in a second direction from the connecting device, the second filter section rotates with respect to the first filter section, thereby causing the electrical connector to break the electrical connection between the first filter section and the second filter section.

According to an embodiment of the invention, a method for disconnecting a connecting pin in an electrical filter, the filter including a first filter section having a first set of electrical filter components, with the first set of electrical filter components including a plurality of first primary tunable coils arranged parallel to each other, and a second filter section having a second set of electrical filter components, with the second set of electrical filter components including a plurality of second primary tunable coils arranged parallel to each other, includes the steps of (a) providing an electrical isolation shield disposed between the first and second filter sections for electrically isolating the first and second filter sections from one another, wherein the electrical isolation shield includes a first plate and a second plate which are rotatable with respect to each other, wherein the first plate includes a first cutout portion and the second plate includes a second cutout portion; (b) locking the first plate to the first filter section; (c) locking the second plate to the second filter section; and (d) disposing the first and second plates such that when the electrical filter is screwed into a connecting device, the first filter section is limited in its rotation with respect to the second filter section such that an opening formed by the first and second cutout portions permits the connecting pin to electrically connect the first filter section with the second filter section, and when the electrical filter is unscrewed from the connecting device, the first filter section rotates with respect to the second filter section such that the connecting pin breaks electrical connection between the first filter section and the second filter section.

According to an embodiment of the invention, a method of breaking an electrical connection between first and second filter sections of an electrical filter contained within a housing, wherein the first filter section includes a first filter circuit and the second filter section includes a second filter circuit, includes the steps of (a) making the first filter section rotatable with respect to the housing; (b) locking the second filter section to the housing; and (c) electrically connecting the first filter circuit to the second filter circuit, such that upon rotating the electrical filter in a first direction into a connecting device, the first and second filter sections are in a locked position, and upon rotating the electrical filter in a second direction from the connecting device, the second filter section rotates with respect to the first filter section, thereby breaking the electrical connection.

DETAILED DESCRIPTION OF THE PREFERRED EMBODIMENT

Figure 1:
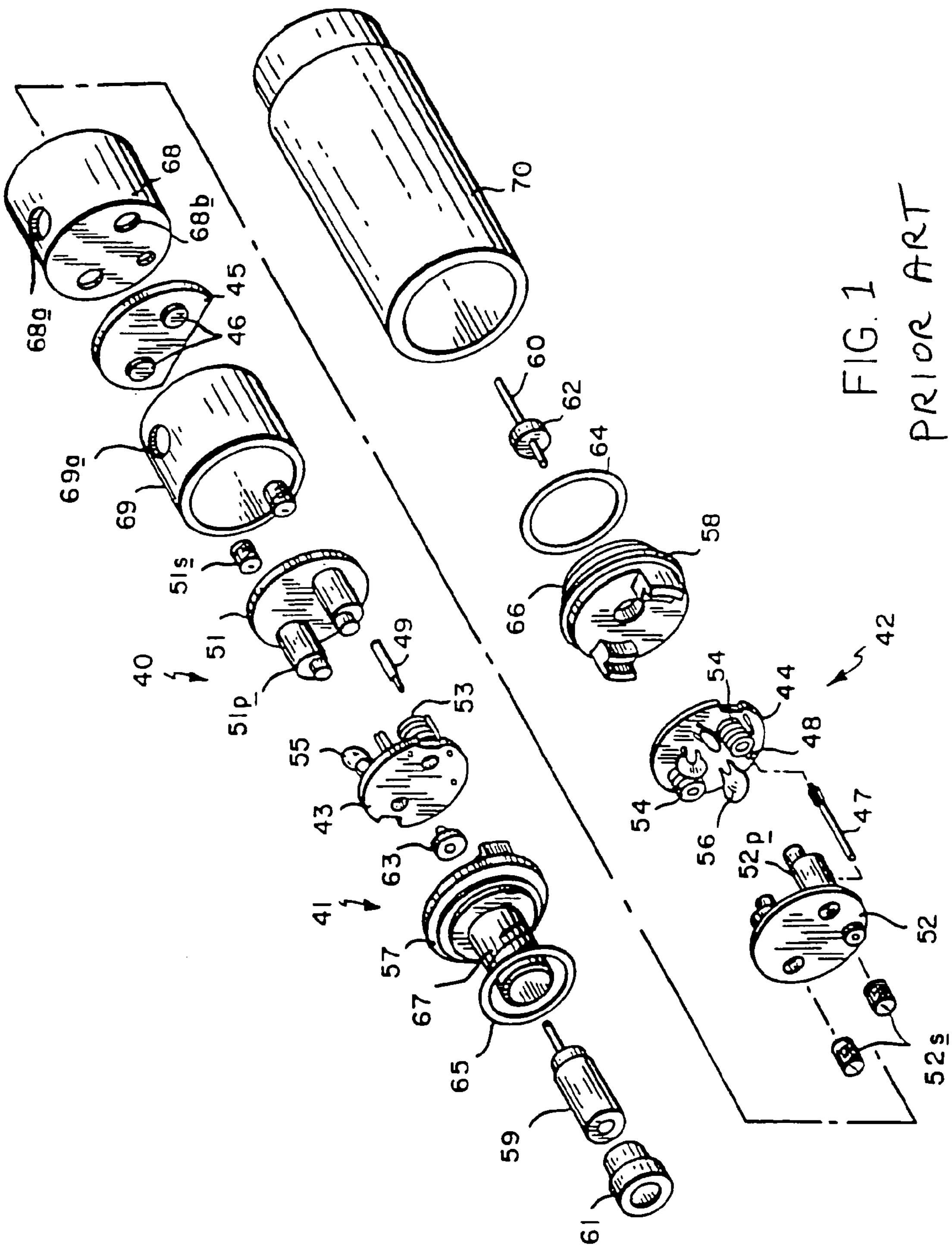
FIG. 1 PRIOR ART
FIG. 1 shows a filter trap assembly according to the prior art.

Referring to FIGS. 1, 2, 3A, and 3B, a prior art electrical filter 40 with multiple filter sections is shown. Filter 40 includes a first filter section 41 and a second filter section 42 separated by an isolation shield 45. First and second filter sections 41, 42 are each provided with circuit boards 43 and 44, respectively. Circuit boards 43, 44 each include pairs of primary tuning coils 53 and 54, respectively, as well as other conventional tuning circuit components 55 and 56. Tuning screw retainer housings 51 and 52 are respectively coupled to the circuit boards 43 and 44 so that screw posts 51*p* and 52*p* are positioned within the center of the primary tuning coils 53 and 54. Tuning set screws 51*s* and 52*s* are adjustably set within the retaining posts 51*p* and 52*p*, respectively, for changing the tuning characteristics of the filter sections. Circuit board 43 includes a connecting pin receiving socket 49 while circuit board 44 includes a connecting pin 47, which are used for electrically coupling filter sections 41 and 42 to one another as is described in more detail below.

The configuration of the circuit boards and the primary tuning coils of each filter section is such that the primary tuning coils are arranged to be parallel to the longitudinal axis A of the overall filter trap 40 by positioning the circuit boards orthogonally with respect to longitudinal axis, while the single thin isolation shield 45 is disposed between the filter sections in a plane P which is also orthogonal to the longitudinal axis.

Circuit boards 43, 44 and associated components of filter sections 41, 42 are housed within cup-shaped housings 69 and 68, respectively. Circuit boards 43 and 44 are supported within housings 69 and 68 by female terminal cap 57 and male terminal cap 58, respectively. Terminal caps 57 and 58 are optionally attached to the open rim of their respective housings 69 and 68, by any conventional bonding method, e.g., gluing or soldering. Once assembled, the entire space within each of the housings 68 and 69 is optionally filled with conventional potting compound through openings 68*a* and 69*a*, respectively. The potting compound provides a mass which serves to rigidify component mountings on the circuit boards and further to protect the filter from damage caused by shocks, vibrations, or moisture. In addition, housings 68 and 69 include set screw access openings 68*b* and 69*b* which allow an operator access to the tuning set screws 51*s* and 52*s*, respectively, during the manufacturing process.

Female terminal end cap 57 includes a female input connector terminal 59 and female connector enclosure 61 which are supported within an externally threaded port 67. Female input connector terminal 59 is connected to circuit board 43 of filter section 41. In turn, male terminal cap 58 includes a male output terminal pin 60, which is connected to circuit board 44 and supported within an internally threaded port 66. Glass-to-metal seals 62 and 63 are incorporated between the connector interfaces and the interior of the filter sections.

Figure 2:
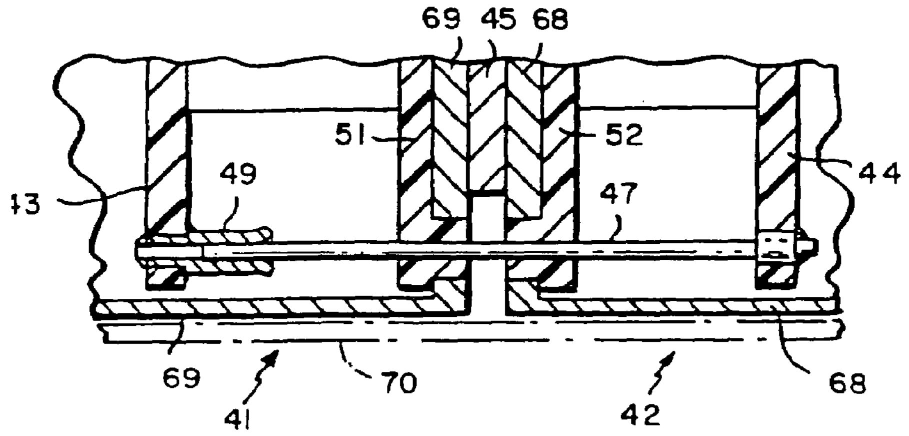
FIG. 2 PRIOR ART
FIG. 2 shows a sectional view of a portion of the filter trap assembly of FIG. 1.
Figure 3A:
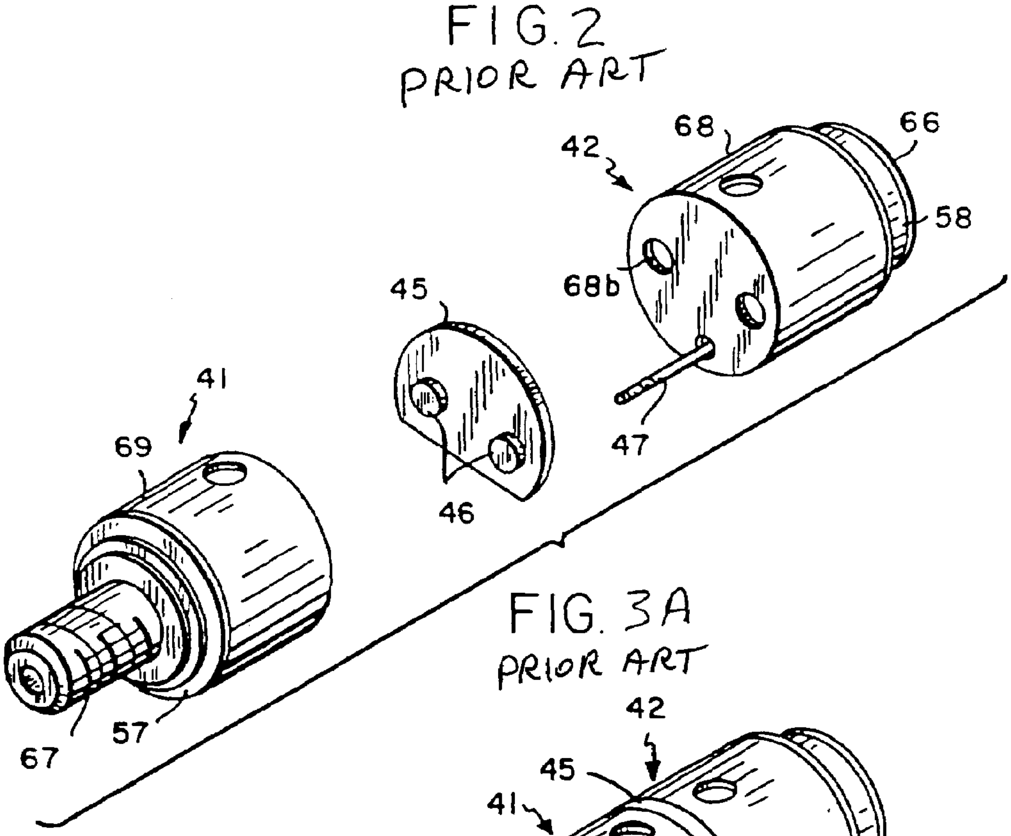
FIG. 3A PRIOR ART
FIG. 3A shows the major components of the filter trap assembly of FIG. 1.
Figure 3B:
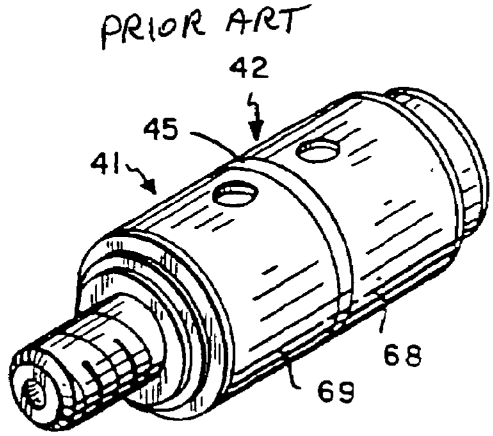
FIG. 3B PRIOR ART
FIG. 3B shows the filter trap assembly of FIG. 1 in its assembled state.

As best illustrated in FIGS. 3A–3B, assembled filter sections 41 and 42 are physically separate entities which may be individually tuned. If for some reason one of the sections malfunctions or is inoperable during the manufacturing process, it may be easily replaced with another filter section which operates correctly. Once the filter sections are tuned to the predetermined frequency, the sections are coupled to one another. The sections 41 and 42 are electrically coupled to one another by the insertion of connecting pin 47 into connecting pin socket 49 as shown in FIG. 2. Isolation shield 45 includes alignment protrusions 46 which interactively engage with the set screw access openings 68*b* of each of the housings 68 and 69. The alignment protrusions 46 serve to both longitudinally align the filter sections 41 and 42 and to stabilize the position of the shield 45 between the filter sections. The configuration also serves to prevent easy access to the tuning set screws 51*s* and 52*s* due to their parallel arrangement with the longitudinal axis of filter 40. Once filter sections 41 and 42 are coupled together, set screw openings 68*b* are not accessible from the outer periphery of housings 68 and 69 unless the filter sections are physically separated. Separation of the filter sections in this manner results in discontinuity in the overall filtering characteristics of the filter; preventing filter 40 from being accurately tuned to a frequency which will not affect the reception of certain cable channels.

The coupled filter sections 41 and 42 are then positioned within and surrounded by a tube sleeve housing 70. A pair of O-rings 64 and 65 are provided respectively between the inner periphery of the tube sleeve housing 70 and an outer periphery of each of filter sections 41 and 42 in order to prevent water, moisture, and vapor from entering into the interior of the housing.

Figure 4:
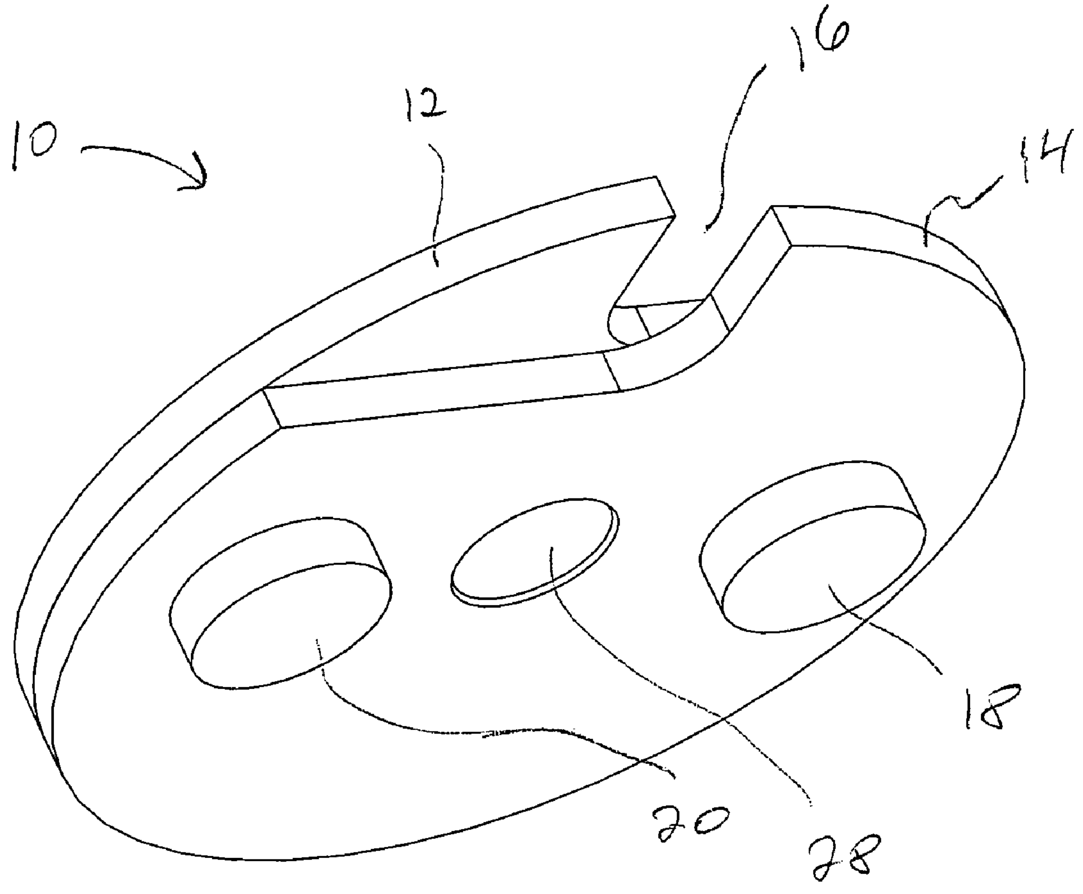
FIG. 4 shows an isolation shield according to an embodiment of the invention.
Figure 5:
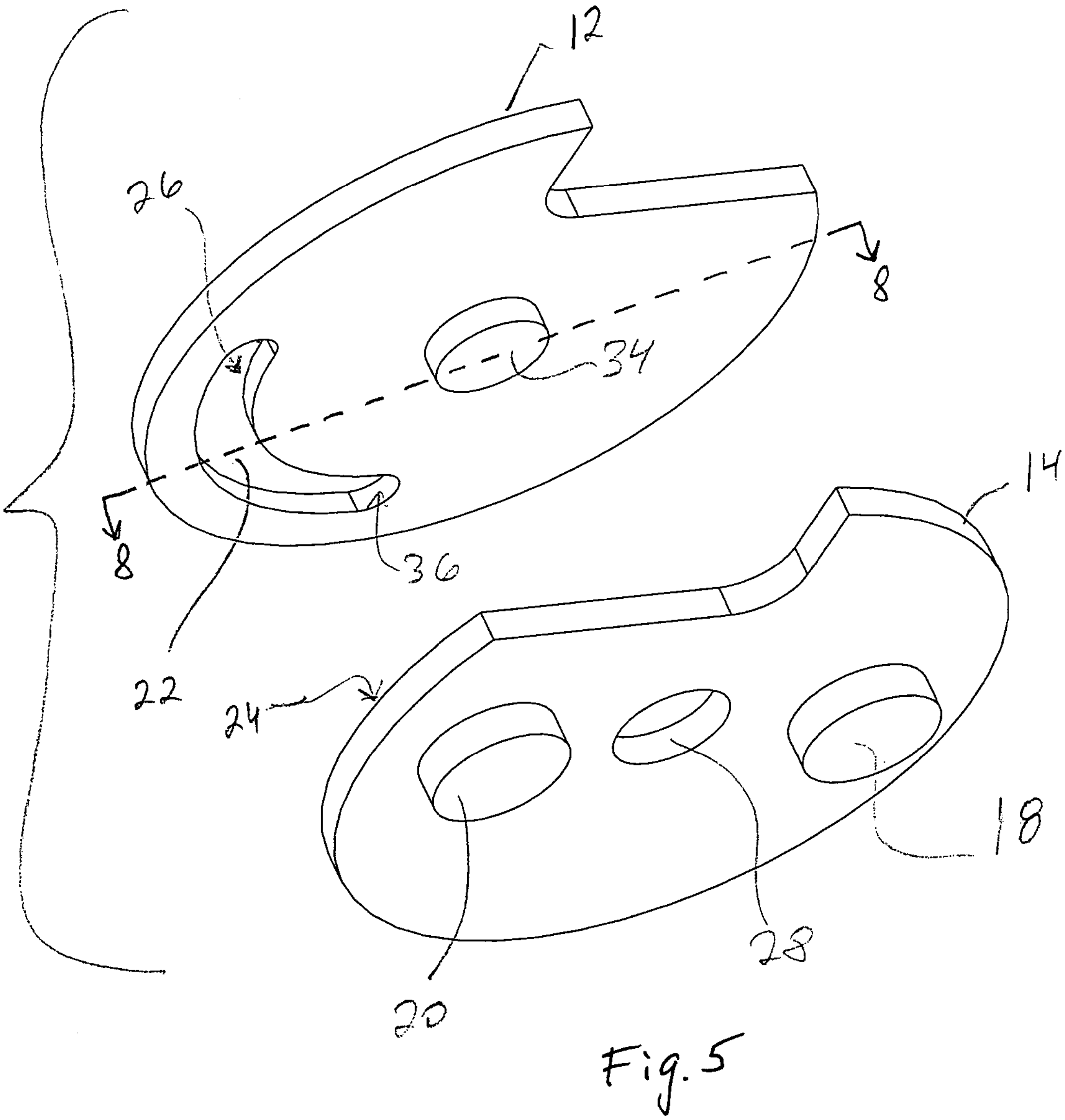
FIG. 5 shows a front perspective view of two isolation plates that together make up the isolation shield of FIG. 4.
Figure 6:
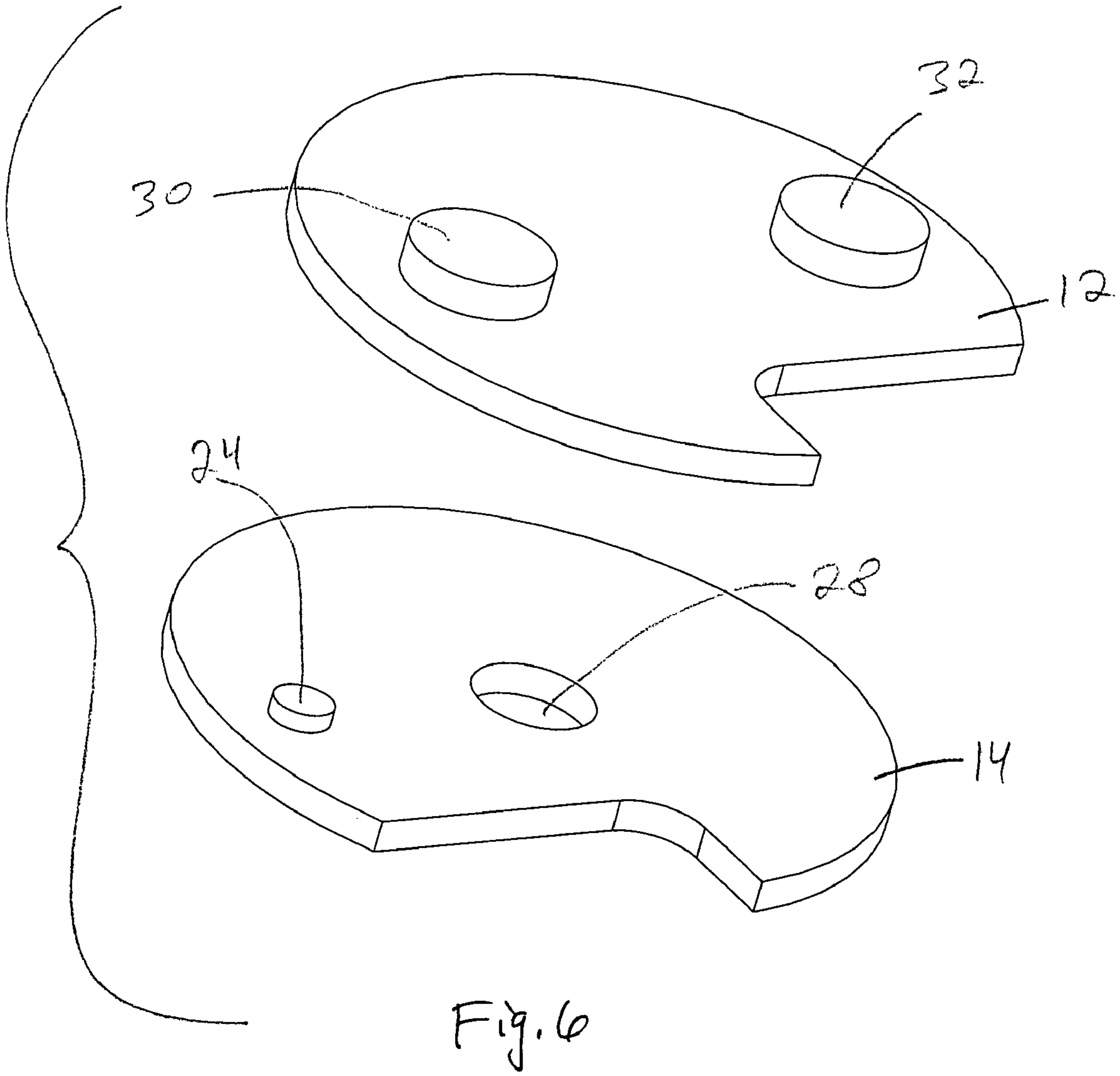
FIG. 6 shows a rear perspective view of the two isolation plates of FIG. 5.

Referring to FIGS. 4–6, an embodiment of the present invention replaces isolation shield 45 with a two-part isolation shield 10. A first plate 12 includes a lug 34 which fits into a hole 28 of a second plate 14. Lug 34 and hole 28 permit first and second plates 12, 14 to concentrically rotate around each other. A plurality of lugs 18 and 20 on second plate 14 fit into tuning screw retainer housing 52 (FIG. 1) while a plurality of lugs 30, 32 fit into tuning screw retainer housing 51 (FIG. 1) to lock first and second plates 12, 14 to first and second filter sections 41, 42 (FIG. 1), respectively. Thus, rotating first filter section 41 in a clockwise direction causes first plate 12 to rotate in a clockwise direction, while rotating second filter section 42 in a clockwise direction causes second plate 14 to rotate in a clockwise direction. A key 24 on second plate 14 fits into a slot or groove such as keyway 22 on first plate 12 to limit the rotation of second plate 14 with respect to first plate 12. When second plate 14 is rotated clockwise with respect of first plate 12 until key 24 moves to a location 26, an opening such as a slot 16 is formed which permits passing connecting pin 47 (FIGS. 1–3A) through or past isolation shield 10.

Figure 9:
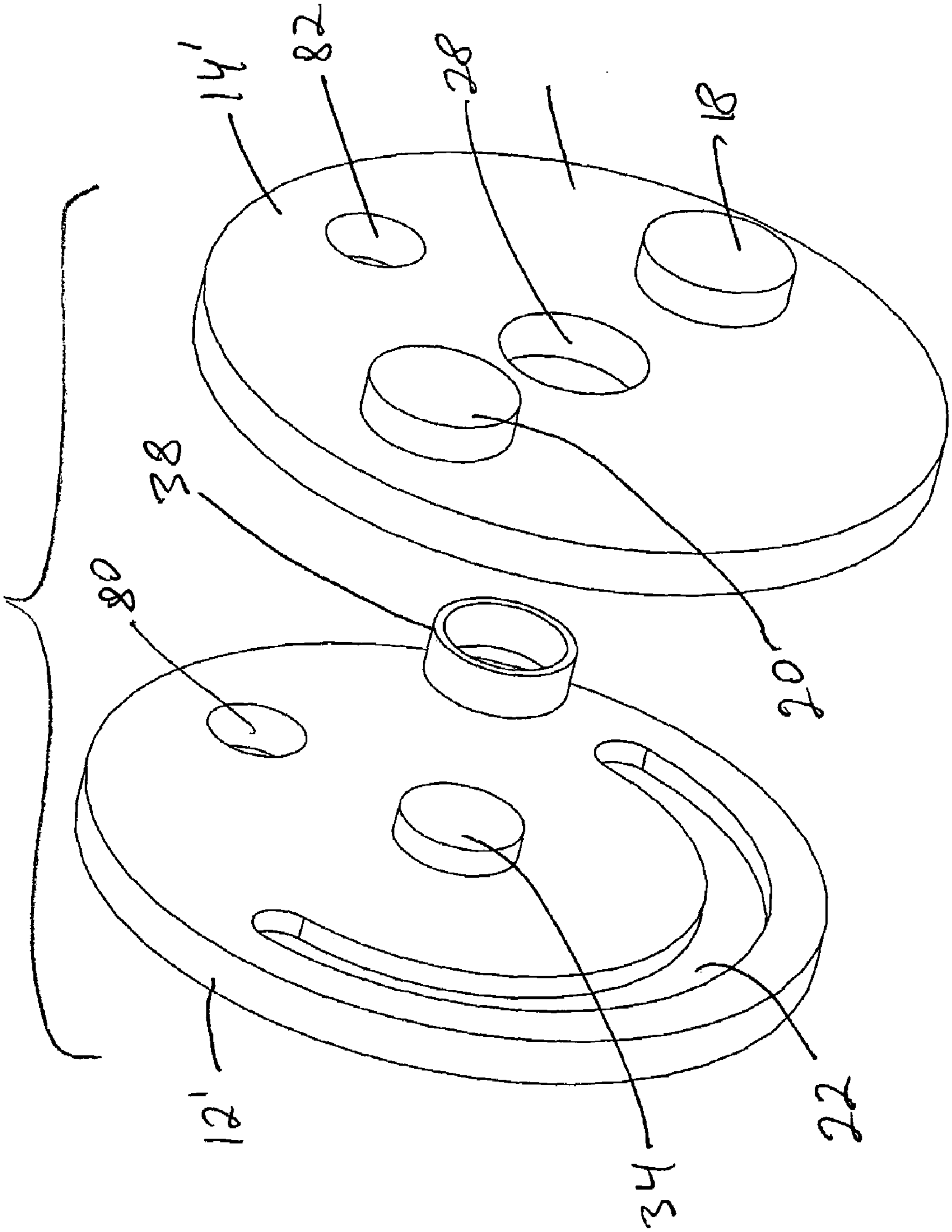
FIG. 9 shows a front perspective view of an embodiment of two isolation plates that together comprise an isolation shield.
Figure 10:
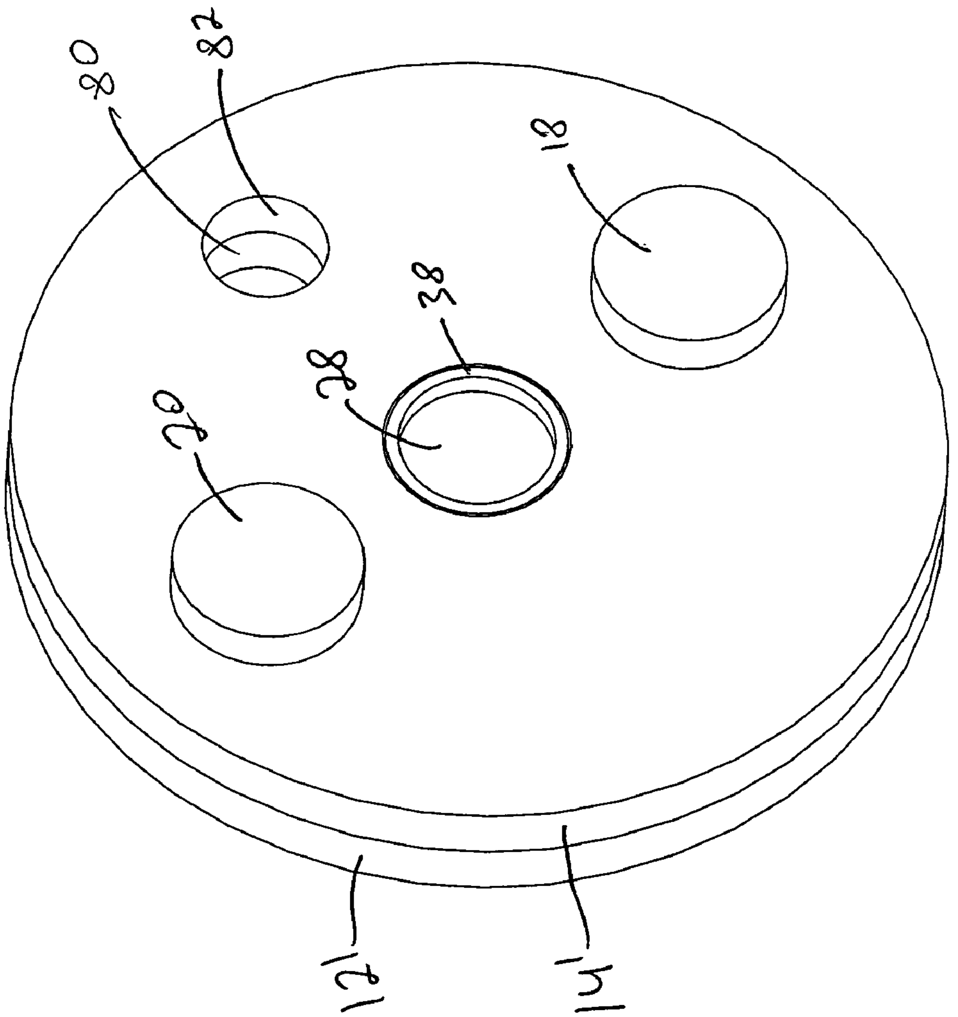
FIG. 10 shows a front perspective view of the assembled isolation shield composed of the isolation plates of FIG. 9.
Figure 11:
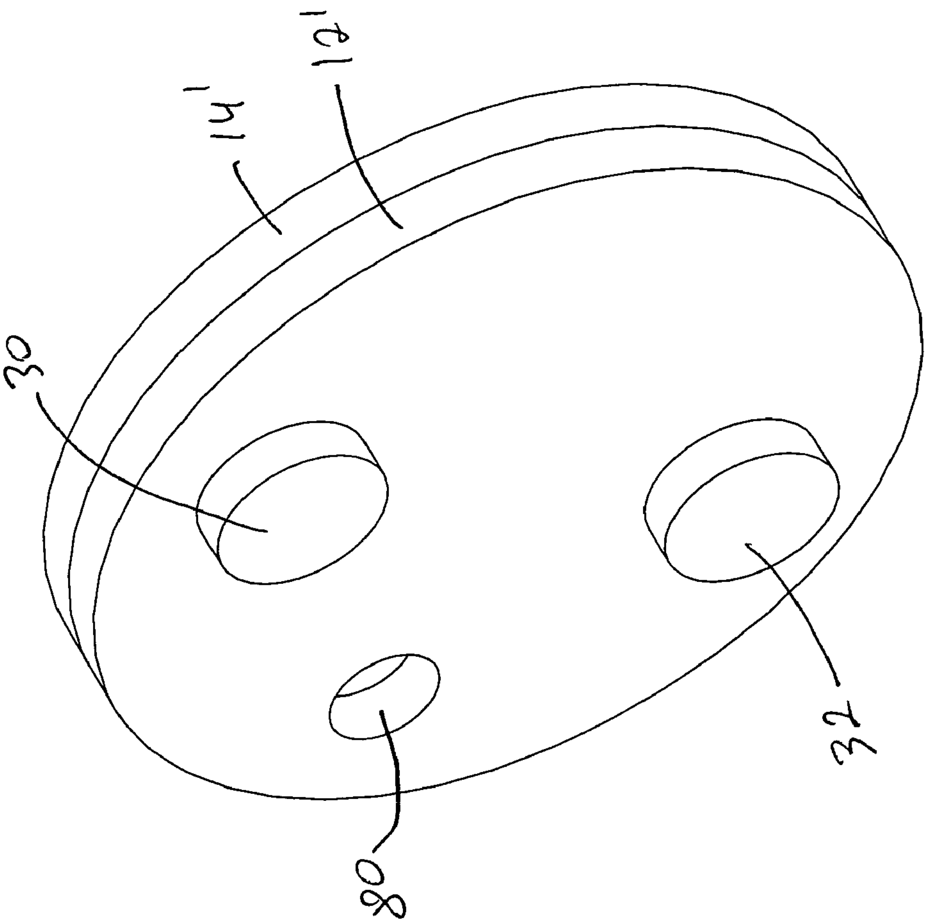
FIG. 11 shows a rear perspective view of the assembled isolation shield composed of the isolation plates of FIG. 9.
Figure 12:
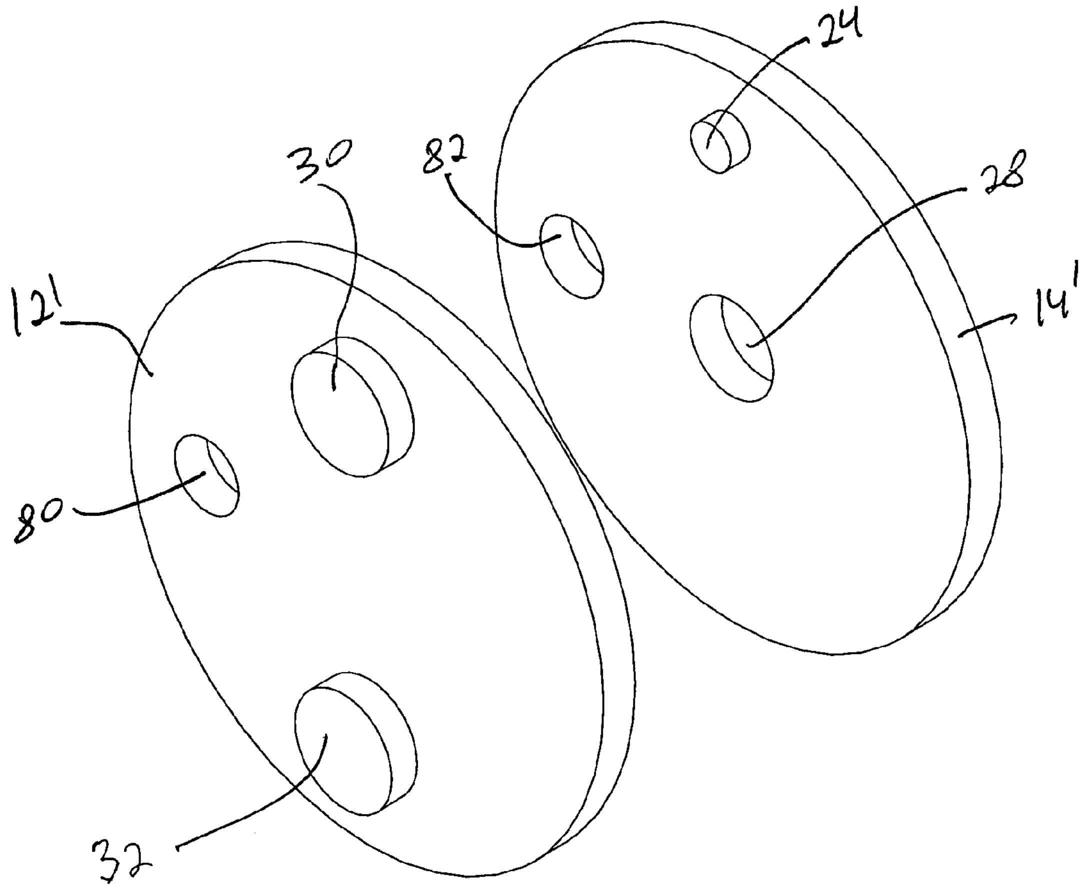
FIG. 12 shows a rear perspective view of the two isolation plates of FIG. 9.

When filter 40 is screwed into a connecting device, such as a port or other filter, it is turned clockwise with a force of between 30 and 40 inch-pounds. Connecting pin 47 remains intact because of key 24 remaining at location 26 and forming slot 16. When filter 40 is unscrewed from the port, second plate 14 rotates counter-clockwise, forcing key 24 to move within keyway 22 towards a location 36. Slot 16 then disappears, so that connecting pin 47 is either sheared or deformed and pulled away from circuit board 43 and/or circuit board 44 (FIG. 1). A light friction insert 38, preferably plastic, such as is shown in FIG. 9 is preferably used to provide enough friction between lug 34 and hole 28.

Figure 7:
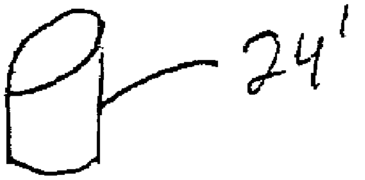
FIG. 7 shows an embodiment of a key used with the isolation plates of FIG. 5.
Figure 8:
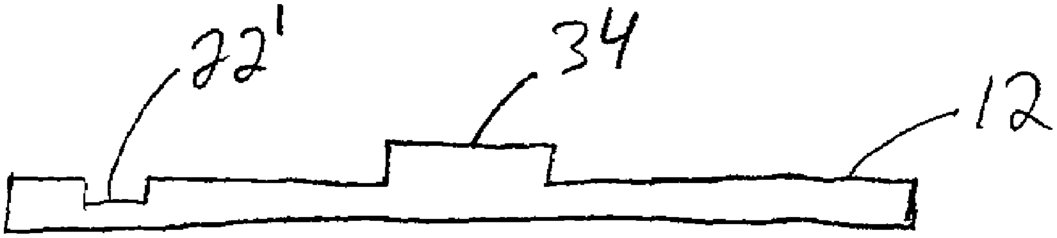
FIG. 8 shows a sectional view of an embodiment of one of the isolation plates of FIG. 5 with a keyway that cooperatively acts with the key of FIG. 7.

Referring to FIGS. 7–8, an alternate embodiment is shown with a key 24' replacing key 24 of FIGS. 5–6, with key 24' being generally cylindrically shaped but with a slanting upper surface. Keyway 22' replaces keyway 22 of FIGS. 5–6, with keyway 22' gradually becoming shallower in the counterclockwise direction. This embodiment permits connecting filter 40 but prevents filter 40 from being reused once it is removed.

Referring to FIGS. 9–12, an embodiment of the invention is shown in which plates 12', 14' include holes 80, 82 respectively. Holes 80, 82 serve the same function as slot 16 in the embodiment of FIGS. 4–6. When plates 12', 14' are aligned during assembly of filter 40, connecting pin 47 is put into place through holes 80, 82. When plates 12', 14' are rotated counterclockwise with respect to each other, holes 80 and 82 are displaced, thus shearing or disconnecting connecting pin 47.

Figure 13:
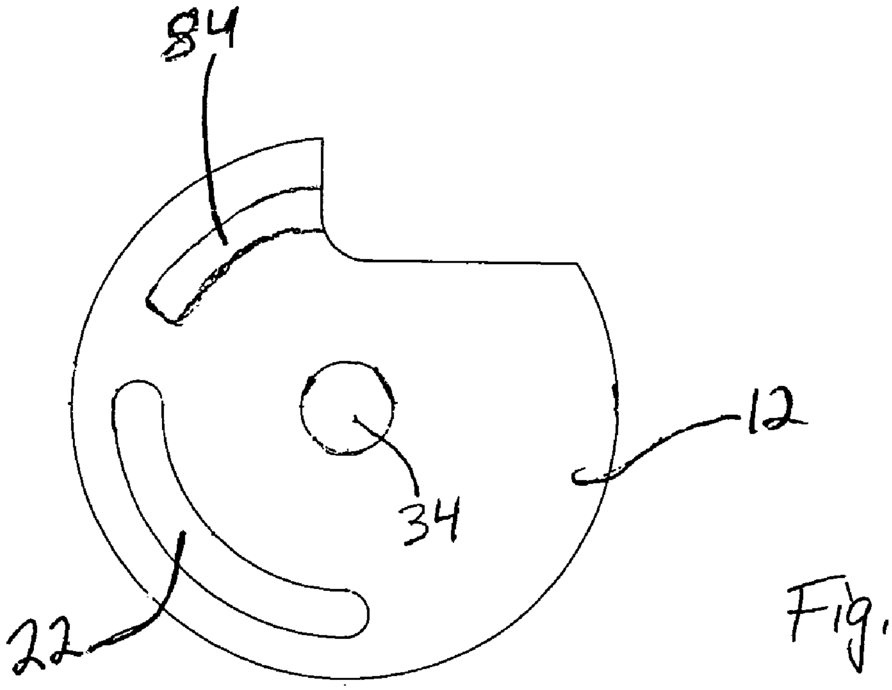
FIG. 13 shows a front elevation view of an embodiment of an isolation plate that contains a relief area.
Figure 14:
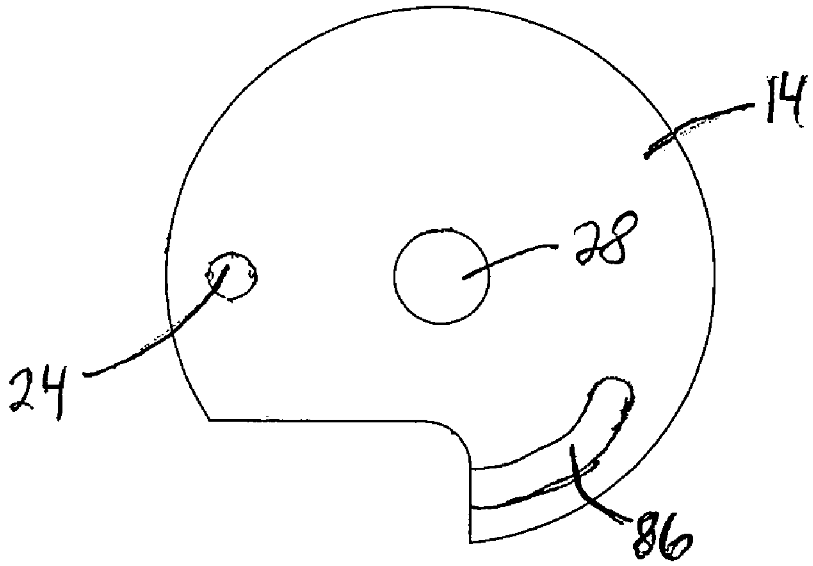
FIG. 14 shows a rear elevation view of an embodiment of an isolation plate that contains a relief area.

Referring to FIGS. 13–14, a variation of the embodiment of FIGS. 4–6 preferably includes a relief area 84 in plate 12 and a relief area 86 in plate 14. It was found experimentally that connecting pin 47 tended to dislocate itself rather than shear when plates 12 and 14 are rotated counterclockwise to each other as filter 40 is unscrewed from its port. To avoid the possibility that someone could then re-screw filter 40 into another port and have connecting pin 47 make proper electrical contact again, relief areas 84, 86 provide space for connecting pin 47 as it is pulled out of alignment. Once connecting pin 47 is pulled into relief areas 84, 86 it is impossible for connecting pin 47 to make proper electrical contact when filter 40 is re-screwed without replacing connecting pin 47.

Although initially designed for a filter which is screwed into an equipment port, the present invention is applicable to a filter screwed into any connecting device, as well as being applicable to multi-part filters where the isolation shield is between any two adjacent filter parts or sections.

Figure 15:
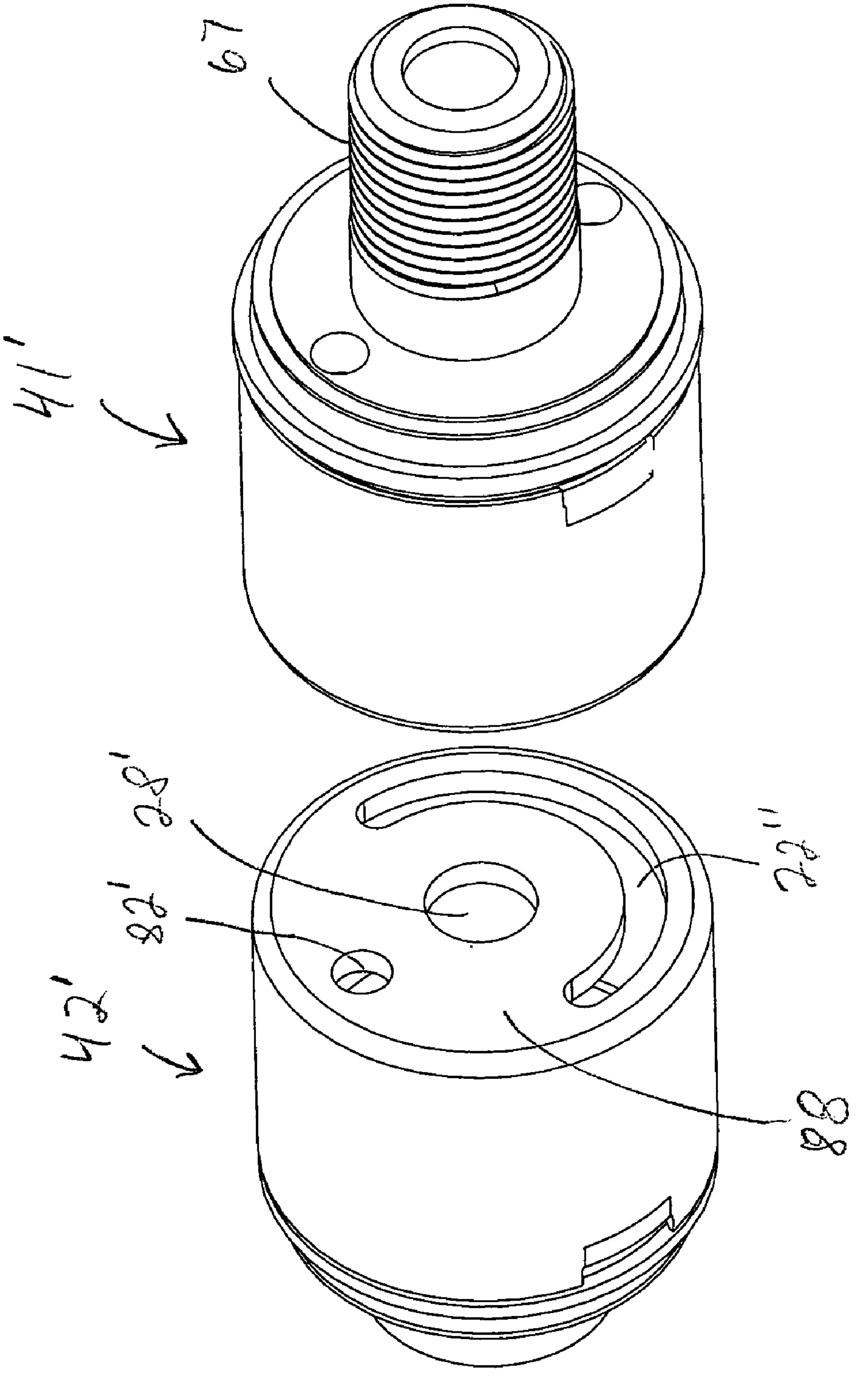
FIG. 15 shows a right perspective view of first and second filter sections in an embodiment of the invention.
Figure 16:
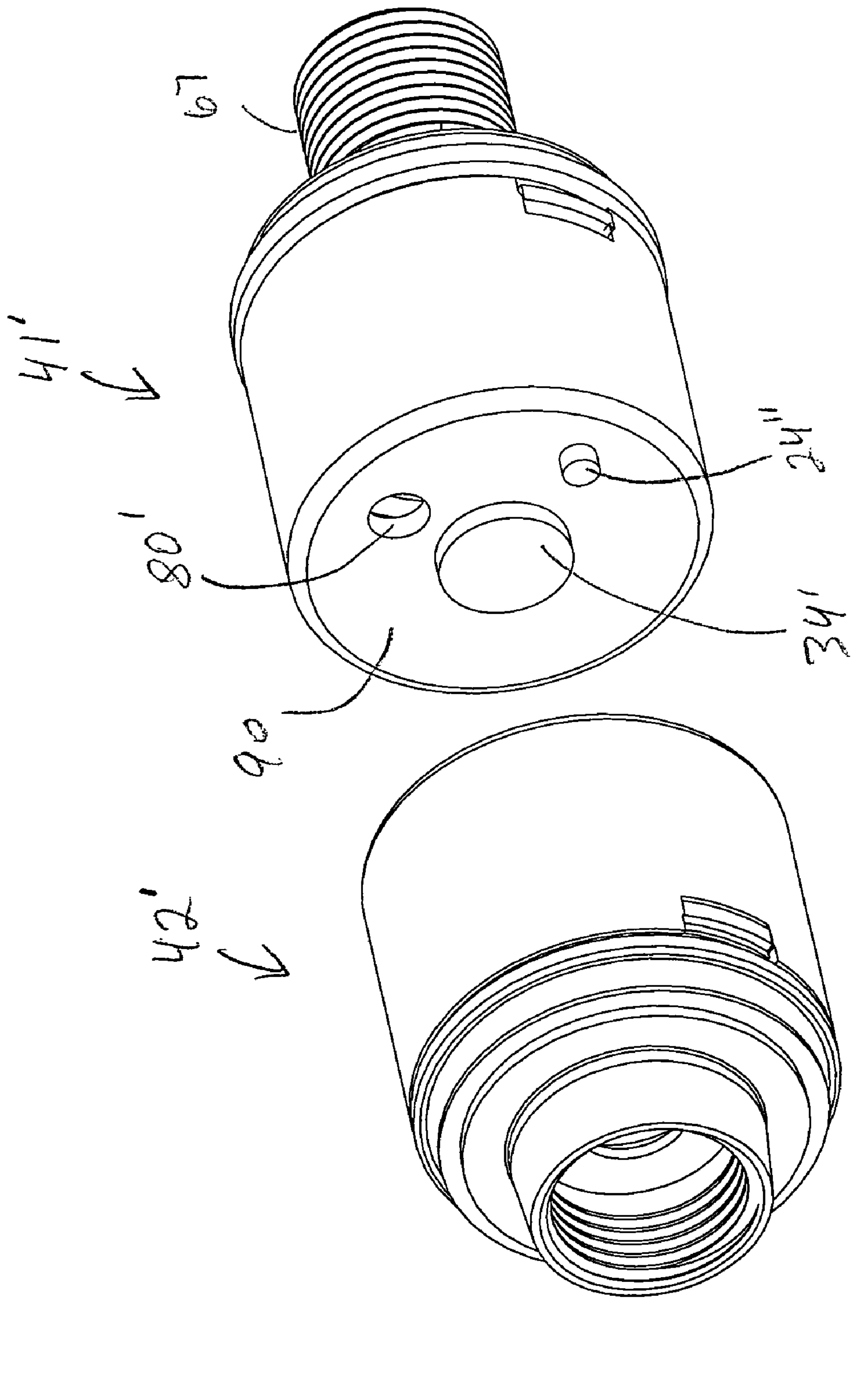
FIG. 16 shows a left perspective view of the embodiment of FIG. 15.
Figure 17:
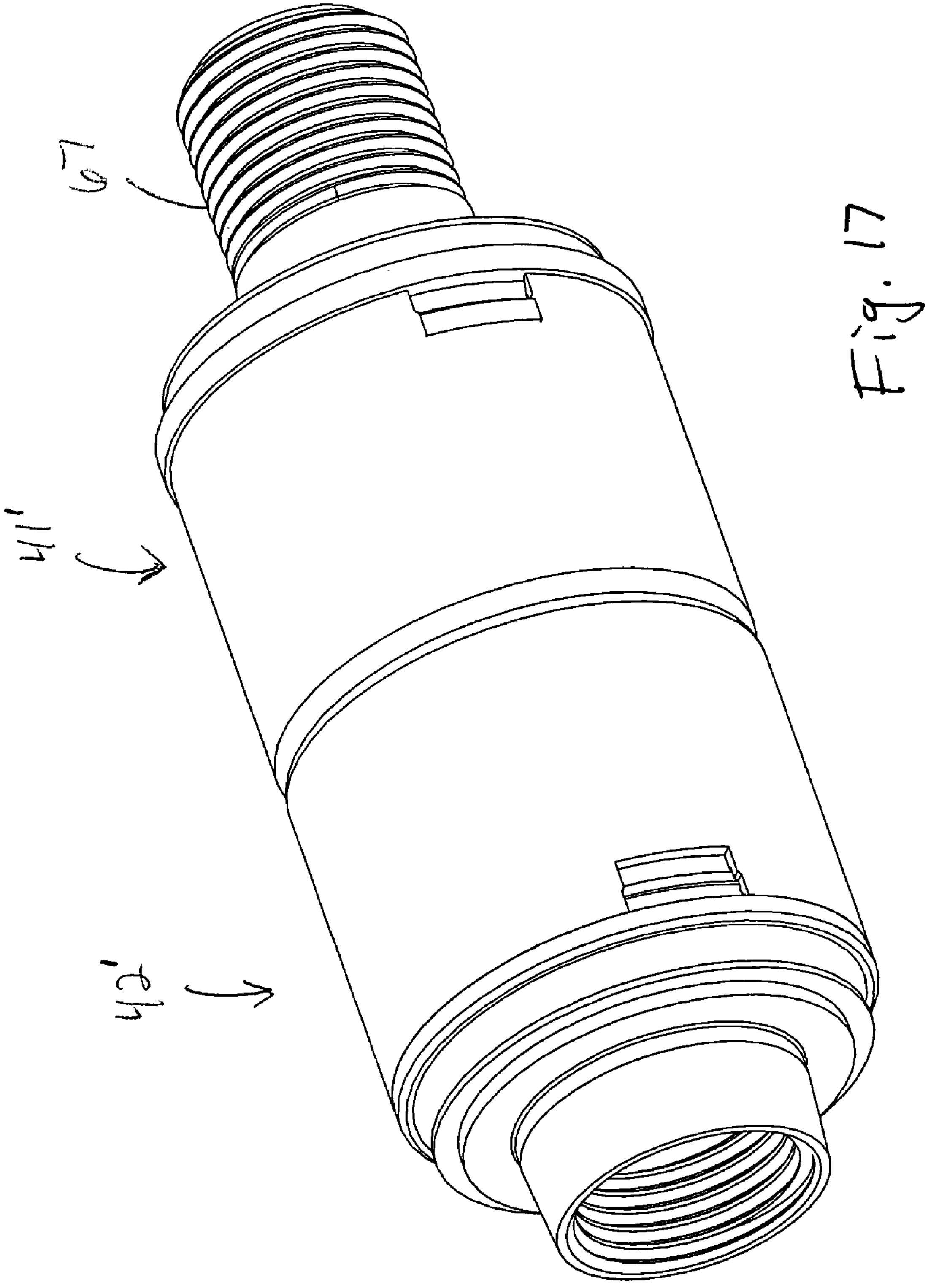
FIG. 17 shows a left perspective view of the first and second filter sections of FIG. 16 connected to each other.

Referring to FIGS. 15–17, an embodiment is shown which doesn't use isolation plates to form the destruction feature of the invention. A first filter section 41', which includes externally threaded port 67, connects with a second filter section 42'. As seen in FIG. 15, a portion 88 of second filter section 42' includes a hole 82', a hole 28', and a keyway 22". Hole 82' and a hole 80' (FIG. 16) in a portion 90 of second filter section 41', when aligned, permit passage of connecting pin 47 (FIG. 2) between first filter section 41' and second filter section 42'. Hole 28' cooperates with a lug 34' in portion 90 (FIG. 16) to permit first filter section 41' and second filter section 42' to rotate with respect to each other. Keyway 22" cooperates with key 24" in portion 90 (FIG. 16) to permit holes 80' and 82' to align when first and second filter sections 41', 42' rotate in a first direction to connect with a connecting device, permitting connecting pin 47 to remain intact, but causing holes 80' and 82' to become unaligned when second filter section 42' rotates in a second direction opposite to the rotation in the first direction, thus causing connecting pin 47 to break the electrical connection between first filter section 41' and second filter section 42'. As a practical matter, first and second filter sections 41', 42' are contained within a housing 70 (FIG. 1), as are first and second filter sections 41, 42 of the previous embodiments. Second filter sections 42 and 42' are connected to housing 70, preferably with an interference fit or a drop of solder, such that rotating housing 70 causes second filter sections 42, 42' to rotate with housing 70, while housing 70 rotates freely around first filter sections 41 and 41', which are held in place from the connection of threaded port 67. Thus, rotating housing 70 in the first direction creates a physical and electrical connection between first and second filter sections 41, 42 and 41', 42' and whatever connecting device (not shown) threaded port 67 is connected to, while rotating housing 70 in the second direction breaks the electrical connection between first and second filter sections 41, 42 and 41', 42' and the connecting device threaded port 67 is connected to. As with the previous embodiments, the embodiment shown in FIGS. 15–17 optionally includes one or more relief areas, as well as an optional friction insert in hole 28'.

Thus, a method of breaking an electrical connection between two filter sections of an electrical filter contained within a housing, where the first filter section includes a first filter circuit and the second filter section includes a second filter circuit, is implemented by making the first filter section rotatable with respect to the housing; (b) locking the second filter section to the housing; and (c) electrically connecting the first filter circuit to the second filter circuit, such that upon rotating the electrical filter in a first direction into a connecting device, the first and second filter sections are in a locked position, and upon rotating the electrical filter in a second direction from the connecting device, the second filter section rotates with respect to the first filter section, thereby breaking the electrical connection.

While the present invention has been described with reference to a particular preferred embodiment and the accompanying drawings, it will be understood by those skilled in the art that the invention is not limited to the preferred embodiment and that various modifications and the like could be made thereto without departing from the scope of the invention as defined in the following claims.

What is claimed is:

1. An electrical filter, comprising:

a housing;

a first filter section having a first filter circuit, wherein the first filter section is located within and rotatable with respect to the housing;

a second filter section having a second filter circuit, wherein the second filter section is located within and locked to the housing;

an electrical connector forming an electrical connection between the first filter circuit and the second filter circuit;

wherein the first filter section and the second filter section are in a locked position upon rotating the electrical filter in a first direction into a connecting device, and upon rotating the electrical filter in a second direction from the connecting device, the second filter section rotates with respect to the first filter section, thereby causing the electrical connector to break the electrical connection.

2. An electrical filter according to claim 1, further comprising:

a first portion of the first filter section including a first cutout area;

a second portion of the second filter section including a second cutout area;

wherein the electrical connector passes through the first and second cutout areas to form the electrical connection between the first and second filter sections.

3. An electrical filter according to claim 2, wherein the first and second cutout areas are first and second holes in the first and second portions, respectively.

4. An electrical filter according to claim 3, further comprising a first relief area in at least one of the first portion and the second portion.

5. An electrical filter according to claim 4, further comprising the first relief area in the first portion and a second relief area in the second portion.

6. An electrical filter according to claim 2, further comprising a key on a side of one of the first and second portions and a corresponding keyway into which the key fits on an adjacent side of another one of the first and second portions, wherein the key and keyway combination limits rotational movement of the first and second portions with respect to each other.

7. An electrical filter according to claim 6, further comprising a first relief area in at least one of the first portion and the second portion.

8. An electrical filter according to claim 7, further comprising the first relief area in the first portion and a second relief area in the second portion.

9. An electrical filter according to claim 6, wherein the keyway is an open slot extending entirely through one of the first and second portions.

10. An electrical filter according to claim 6, wherein the keyway is a groove.

11. An electrical filter according to claim 2, comprising:

a plurality of first primary tunable coils arranged parallel to each other in the first filter circuit;

a plurality of second primary tunable coils arranged parallel to each other in the second filter circuit;

the first portion of the first filter section being a first isolation shield plate and the second portion of the second filter section being a second isolation shield plate for electrically isolating the first and second filter sections from one another;

the first isolation shield plate and the second isolation shield plate being rotatable with respect to each other;

the first isolation shield plate being locked to the first filter section; and the second isolation shield plate being locked to the second filter section.

12. An electrical filter according to claim 11, wherein the first and second cutout areas are first and second holes in the first and second portions, respectively.

13. An electrical filter according to claim 12, further comprising a first relief area in at least one of the first portion and the second portion.

14. An electrical filter according to claim 13, further comprising the first relief area in the first portion and a second relief area in the second portion.

15. An electrical filter according to claim 11, further comprising a key on a side of one of the first and second portions and a corresponding keyway into which the key fits on an adjacent side of another one of the first and second portions, wherein the key and keyway combination limits rotational movement of the first and second portions with respect to each other.

16. An electrical filter according to claim 15, further comprising a first relief area in at least one of the first portion and the second portion.

17. An electrical filter according to claim 16, further comprising the first relief area in the first portion and a second relief area in the second portion.

18. An electrical filter according to claim 15, wherein the keyway is an open slot extending entirely through one of the first and second portions.

19. An electrical filter according to claim 15, wherein the keyway is a groove.

20. An electrical filter according to claim 19, wherein the groove has a first depth at one end of the groove and a second depth at another end of the groove, wherein the second depth is less than the first depth, such that the keyway limits key travel in one rotational direction and permits key travel in an opposite rotational direction.

21. An electrical filter according to claim 20, wherein the key is shaped as a truncated cylinder, with the truncation being a plane not parallel to a base of the cylinder, such that a plane orthogonal to the base of the truncated cylinder, passing through a center of the base, and being perpendicular to a radius of the cylinder describes a first line of intersection with the truncated cylinder and describes a second line of intersection with the truncated cylinder, and wherein the first line of intersection precedes the second line of intersection as the key moves in a clockwise direction, a length of the first line of intersection is greater than a length of the second line of intersection.

22. An electrical filter according to claim 1, wherein the connecting device is an equipment port.

23. An electrical filter according to claim 1, wherein the connecting device is a third filter section.

24. An electrical filter according to claim 11, further comprising a lug centered in one of the first and second isolation shield plates and a corresponding hole in another of the first and second isolation shield plates.

25. An electrical filter according to claim 24, further comprising a plastic limited frictional clutch disposed in the hole.

26. A method for disconnecting a connecting pin in an electrical filter, the filter including a first filter section having a first set of electrical filter components, with the first set of electrical filter components including a plurality of first primary tunable coils arranged parallel to each other, and a second filter section having a second set of electrical filter components, with the second set of electrical filter components including a plurality of second primary tunable coils arranged parallel to each other, the method comprising the steps of:

providing an electrical isolation shield disposed between the first and second filter sections for electrically isolating the first and second filter sections from one another, wherein the electrical isolation shield includes a first plate and a second plate which are rotatable with respect to each other, wherein the first plate includes a first cutout portion and the second plate includes a second cutout portion;

locking the first plate to the first filter section;

locking the second plate to the second filter section; and disposing the first and second plates such that when the electrical filter is screwed into a connecting device, the first filter section is limited in its rotation with respect to the second filter section such that an opening formed by the first and second cutout portions permits the connecting pin to electrically connect the first filter section with the second filter section, and when the electrical filter is unscrewed from the connecting device, the first filter section rotates with respect to the second filter section such that the connecting pin breaks electrical connection between the first filter section and the second filter section.

27. A method according to claim 26, wherein the first and second cutout portions are first and second holes in the first and second plates, respectively.

28. A method according to claim 27, wherein at least one of the first plate and the second plate includes a first relief area.

29. A method according to claim 28, wherein the first relief area is in the first plate and a second relief area is in the second plate.

30. A method according to claim 26, wherein the connecting device is an equipment port.

31. A method according to claim 26, wherein the connecting device is a third filter section.

32. A method according to claim 26, wherein the step of disposing further comprises providing a key on a side of one of the first and second plates and a corresponding keyway into which the key fits on an adjacent side of another one of the first and second plates, wherein the key and keyway combination limits rotational movement of the first and second plates with respect to each other.

33. A method according to claim 32, wherein at least one of the first plate and the second plate includes a first relief area.

34. A method according to claim 33, wherein the first relief area is in the first plate and a second relief area is in the second plate.

35. A method according to claim 32, wherein the keyway is an open slot extending entirely through one of the first and second plates.

36. A method according to claim 32, wherein the keyway is a groove.

37. A method of breaking an electrical connection between first and second filter sections of an electrical filter contained within a housing, wherein the first filter section includes a first filter circuit and the second filter section includes a second filter circuit, comprising the steps of:

making the first filter section rotatable with respect to the housing;

locking the second filter section to the housing; and electrically connecting the first filter circuit to the second filter circuit, such that upon rotating the electrical filter in a first direction into a connecting device, the first and second filter sections are in a locked position, and upon rotating the electrical filter in a second direction from the connecting device, the second filter section rotates with respect to the first filter section, thereby breaking the electrical connection.

38. A method according to claim 37, further comprising the steps of:

including a first cutout area in a first portion of the first filter section; and including a second cutout area in a second portion of the second filter section;

wherein the electrical connection passes through the first and second cutout areas.

39. A method according to claim 38, further comprising the step of providing a first relief area in at least one of the first and second portions.

40. A method according to claim 39, further comprising the step of providing a second relief area in another one of the first and second portions.

41. A method according to claim 37, further comprising the step of providing a key on one of the first and second portions and a corresponding keyway into which the key fits on another one of the first and second portions, wherein the key and keyway combination limits rotational movement of the first and second filter sections with respect to each other.

42. A method according to claim 41, wherein the keyway is an open slot extending entirely through one of the first and second portions.

43. A method according to claim 41, wherein the keyway is a groove.

* * * * *